(12) United States Patent
Hsieh et al.

(10) Patent No.: US 6,448,595 B1
(45) Date of Patent: Sep. 10, 2002

(54) ACTIVE PHOTODIODE CMOS IMAGE SENSOR STRUCTURE

(75) Inventors: Po-Yao Hsieh, Taipei Hsien; Chih-Wei Hsu, Taipei, both of (TW)

(73) Assignee: Twin Han Technology Co., Ltd., Taipei (TW)

( * ) Notice: Subject to any disclaimer, the term of this patent is extended or adjusted under 35 U.S.C. 154(b) by 99 days.

(21) Appl. No.: 09/603,574

(22) Filed: Jun. 26, 2000

(51) Int. Cl.⁷ .............................................. H01L 31/062
(52) U.S. Cl. ...................... 257/292; 257/293; 257/229; 257/232; 257/233
(58) Field of Search ................................. 438/199, 299, 438/301; 257/292, 293, 53, 232, 233

(56) References Cited

U.S. PATENT DOCUMENTS 6,023,081 A * 2/2000 Drowley et al. ............ 257/292
6,232,626 B1 * 5/2001 Rhodes ........................ 257/292
6,306,679 B1 * 10/2001 Kang et al. .................... 438/73

* cited by examiner

Primary Examiner—David Nelms
Assistant Examiner—Thao P Le
(74) Attorney, Agent, or Firm—J.C. Patents

(57) ABSTRACT

An active photodiode CMOS image sensor comprising a light-sensitive photodiode region, a transistor and a cover layer. The light-sensitive region is formed in a substrate body and the transistor is formed above the substrate body. The source region of the transistor is connected to the light-sensitive region. The cover layer is formed above the light-sensitive photodiode region using a method similar to method used to form the gate dielectric layer.

8 Claims, 3 Drawing Sheets

ACTIVE PHOTODIODE CMOS IMAGE SENSOR STRUCTURE

BACKGROUND OF THE INVENTION

1. Field of Invention

The present invention relates to an image sensor structure and method of manufacture. More particularly, the present invention relates to an active photodiode CMOS image sensor structure and method of manufacture.

2. Description of Related Art

Photodiode image sensor is currently a common type of image sensing device. Typically, a photodiode image sensor includes a reset transistor and a light-sensing region formed by diodes. Each photodiodes is formed by joining an n-doped region with a p-doped body ($n^+/p$ junction). During operation, a voltage is applied to the gate terminal of the reset transistor so that the reset transistor is switched on and the capacitor at the $n^+/p$ diode junction is charged up. When the diode is charged to a certain potential level, the reset transistor is switched off so that the $n^+/p$ diode is reverse biased leading to the formation of a depletion region. Electron/hole pairs are generated when light shines on the light-sensitive $n^+/p$ region. The electrons and the holes are sorted out by the electric field within the depletion region. The electrons migrate towards the n-doped region so that electric potential in the n-doped region will drop. On the other hand, the holes move away from the depletion region towards the p-doped body. Ultimately, the holes are channel away. If the electrons in the n-doped region are transferred by a transistor to a bus line, electric charges produced by photons can be read from an output terminal without going through any amplification. This type of photosensitive device is called passive pixel photodiode. However, if the n-doped region is connected to a source follower formed from a transfer transistor, the source follower is able to supply a large enough current to stabilize the voltage at the output terminal and reduce noises. This type of low noise photosensitive device is often called active pixel photodiode.

In recent years, active photodiode CMOS image sensor has been used in some low-end image sensing equipment as a replacement for high cost charge couple device (CDD). In fact, active photodiode CMOS image sensor has high quantum efficiency, low read-out noises, high dynamic range and random access property. Moreover, the active photodiode CMOS image sensor is a hundred percent compatibility with other CMOS devices. Hence, the image sensor can easily integrate with other control circuits, analogue to digital (A/D) converters and digital signal processors to form a system on a silicon chip (so-called system on a chip).

FIG. 1 is a schematic cross-sectional view of a conventional active photodiode CMOS image sensor. To form the conventional active photodiode CMOS image sensor shown in FIG. 1, several steps are required. First, a substrate 100 is provided, and then an isolation region 102 is formed on the substrate 100. An oxide layer and a polysilicon layer are formed over the substrate 100. Photolithographic and etching processes are carried out to pattern the oxide layer and the polysilicon layer to form the gate oxide layer 104 and the polysilicon gate 106 of a reset transistor 120. Using the isolation region 102 and the polysilicon gate 106 as a mask, an ion implantation and a thermal drive-in operation are sequentially carried out. Ultimately, doped regions 112 are formed in source/drain regions 108 and photodiode sensing regions 110. Spacers 114 are next formed over the sidewalls of the polysilicon gate 106 and the gate oxide layer 104.

In general, a self-aligned silicide (Salicide) process is included in the manufacturing of a CMOS transistor for depositing a silicide layer over polysilicon gate terminals 106 and source/drain terminals 108 so that electrical resistance at those terminals are reduced.

However, in the manufacturing of active photodiode CMOS image sensor, the self-aligned silicide process will deposit a silicide layer over the light-sensitive photodiode region 110 in addition to the polysilicon gate 106 and the source/drain terminal 108. The addition of a silicide layer over the light-sensitive photodiode region 110 will increase the amount of back reflections of the incoming light resulting in a considerable reduction in photoelectric conversion and lowering of sensor sensitivity.

In addition, the interface state of the surface the photodiode sensor region 110 contains numerous defects. When light impinges upon the $n^+/p$ light-sensitive photodiode region 110, electron/hole pairs are produced. However, the separation of electrons and holes by the electric field in the depletion region will be affected by defects in the interface states leading to a relatively large surface leakage of current.

SUMMARY OF THE INVENTION

Accordingly, the purpose of the present invention is to provide an active photodiode CMOS image sensor structure capable of increasing photoelectric conversion rate so that overall sensitivity of the sensor improves.

To achieve these and other advantages and in accordance with the purpose of the invention, as embodied and broadly described herein, the invention provides an active photodiode CMOS image sensor structure. The sensor includes a light-sensitive photodiode region, a transistor and a cap layer. The light-sensitive photodiode region is buried within a substrate body. The transistor is formed over the substrate body. The source region of the transistor is connected to a portion of the light-sensitive photodiode region. The cap layer is formed as a gate dielectric layer above the light-sensitive photodiode region.

This invention also provides a method of forming the active photodiode CMOS image sensor. A gate dielectric layer, a gate conductive layer and a cap layer are sequentially formed over a substrate body. Photolithographic and etching techniques are employed to pattern the gate dielectric layer, the gate conductive layer and the cap layer into a gate structure. An ion implantation is carried out followed by a thermal drive-in operation so that doped source/drain regions and doped light-sensitive photodiode regions are formed. A cover layer is formed over the exposed substrate body. Thereafter, a portion of the cover layer is removed retaining a cover layer over the light-sensitive photodiode region. The cap layer is removed and then spacers are formed on the sidewalls of the gate structure. Finally, a self-aligned silicide process is carried out to form a silicide layer above the gate conductive layer and the source/drain regions.

By forming a cover layer over the light-sensitive photodiode region, no silicide layer is formed over the light-sensitive photodiode region after a self-aligned silicide process. In the absence of a light-reflecting silicide layer, the reflection of a large quantity light from the light-sensitive photodiode region is avoided.

In addition, the cover layer on top of the light-sensitive photodiode region is formed under similar conditions as forming the gate dielectric layer. Since the gate dielectric layer is an oxide layer formed by a quality process, the interface between the dielectric layer and the substrate body has few defects. With very little current leak from the surface of the light-sensitive regions, only a very small dark current flows in the sensing device.

Moreover, since the cover layer is formed in the thermal drive-in step for forming the source/drain region, only one more photomask-making step is required when compared with a standard CMOS manufacturing process.

Furthermore, the light-sensitive photodiode region has a lower dopant concentration than a conventional photodiode region. Consequently, a thicker depletion region is produced when a voltage is applied to the light-sensitive photodiode region. Ultimately, a higher photoelectric conversion rate can be obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
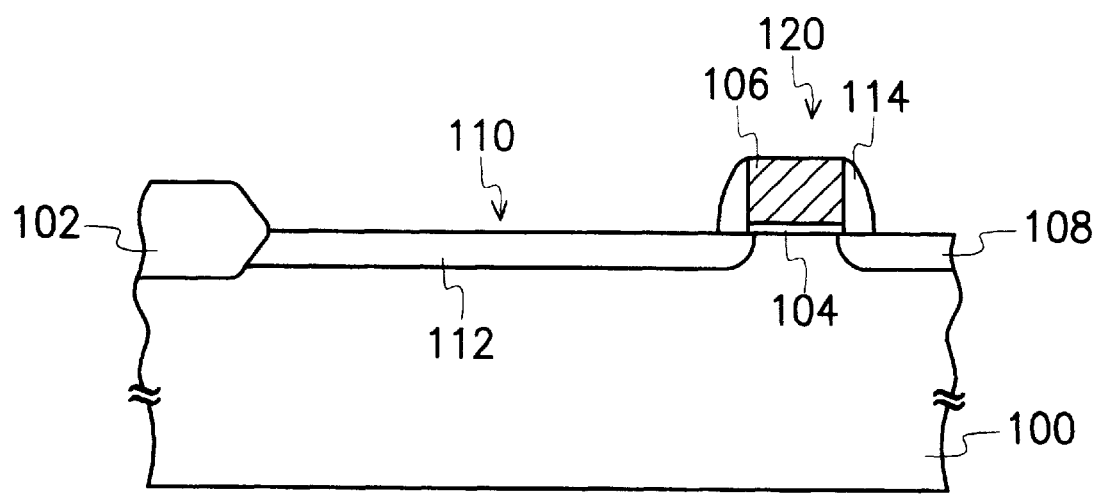
FIG. 1 is a schematic cross-sectional view of a conventional active photodiode CMOS image sensor.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
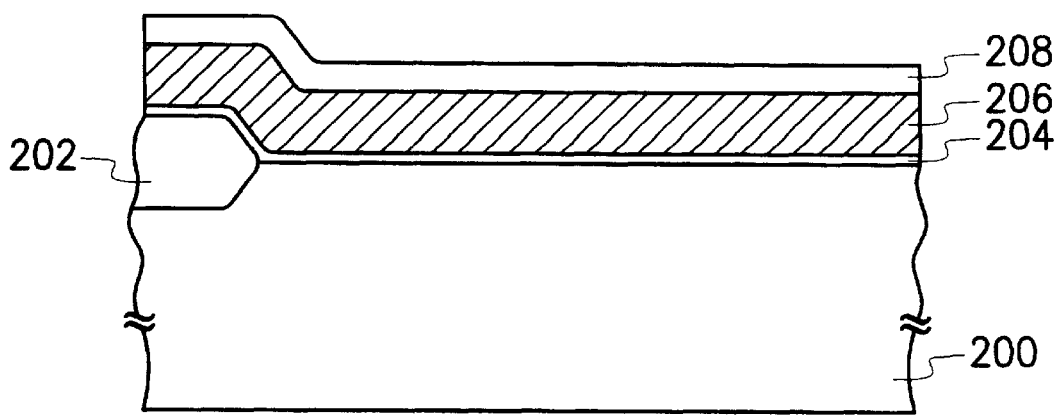
FIGS. 2A through 2F are cross-sectional views showing the progression of steps for producing an active photodiode CMOS image sensor according to one preferred embodiment of this invention.
Figure 2B:
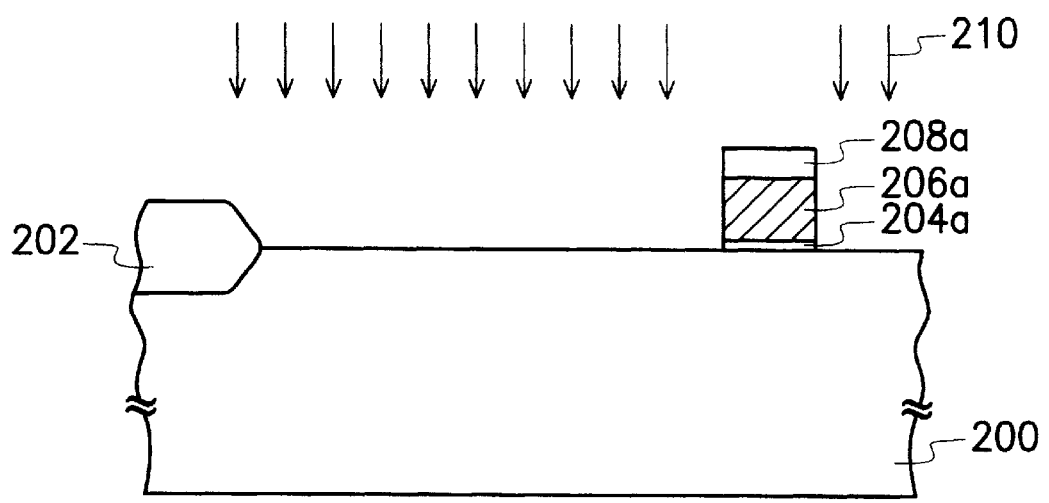
Figure 2C:
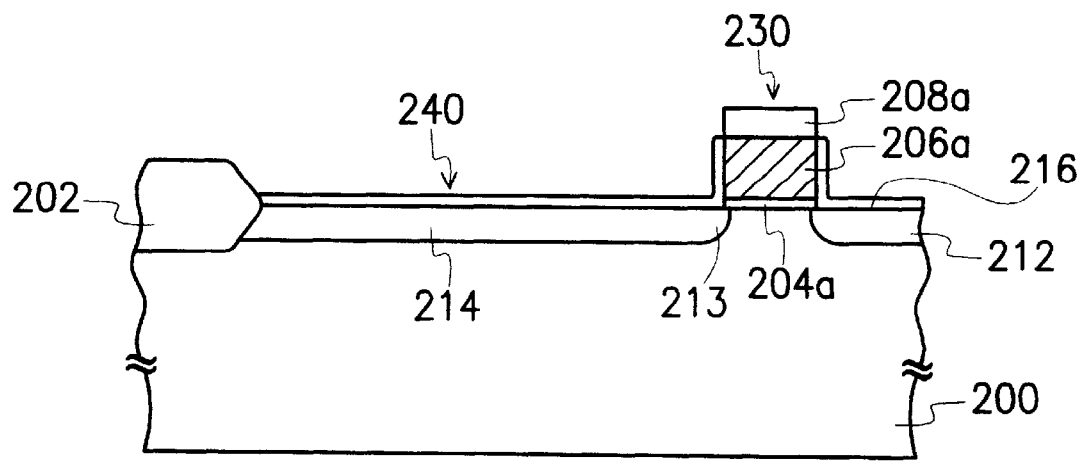
Figure 2D:
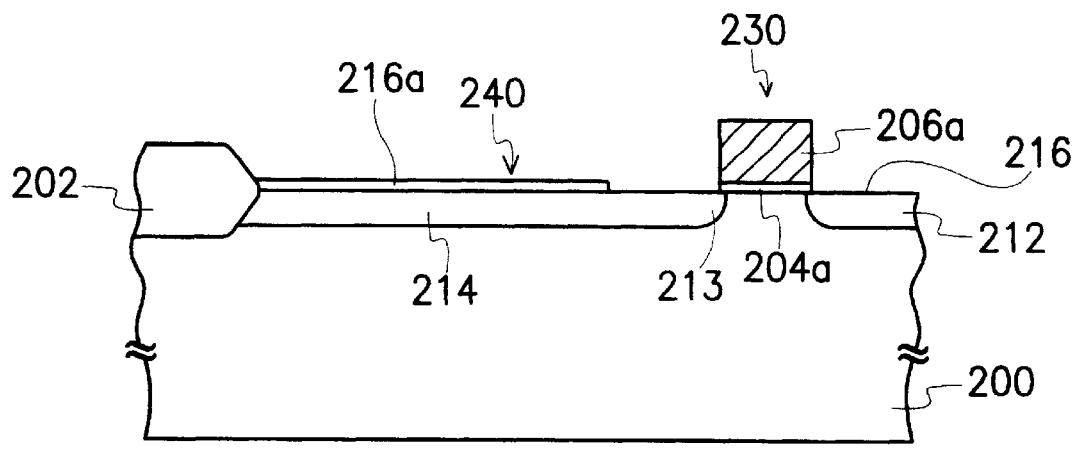
Figure 2E:
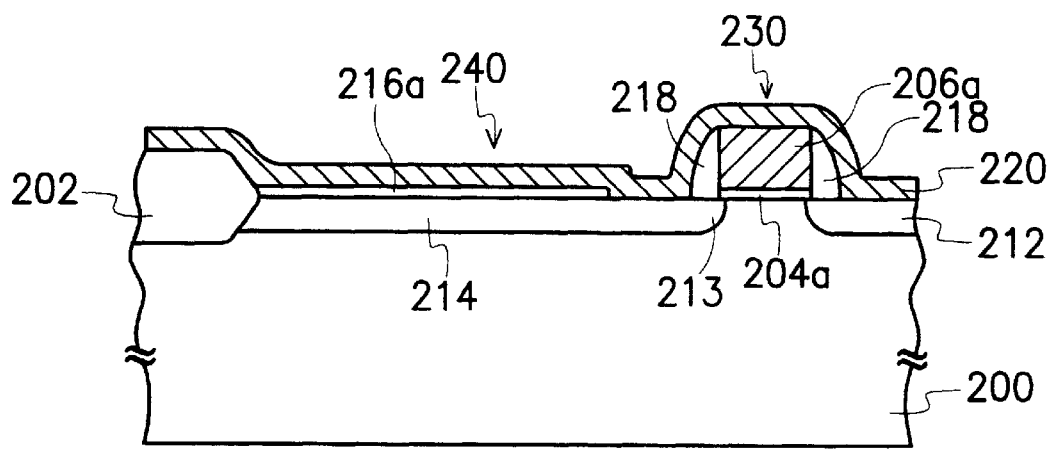
Figure 2F:
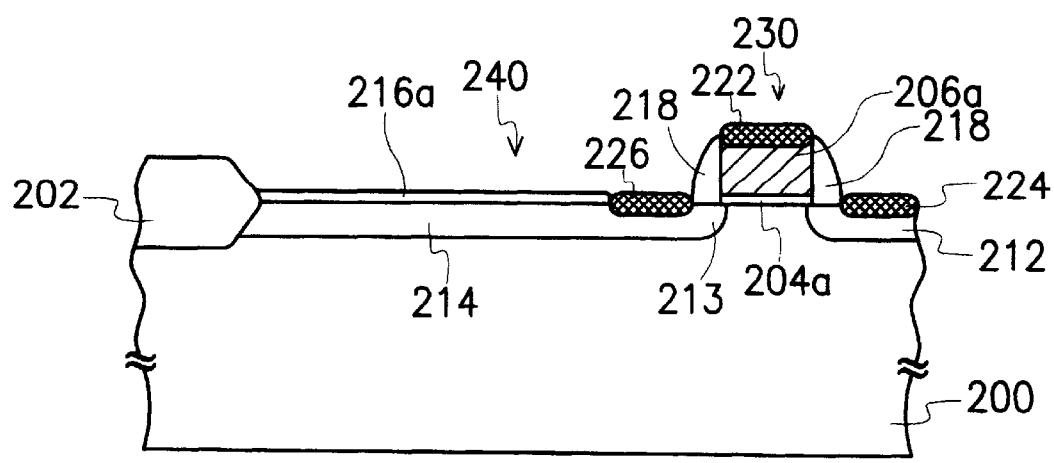

FIG. 2F is a cross-sectional view of an active photodiode CMOS image sensor according to this invention. The active photodiode CMOS image sensor includes a transistor 230, a light-sensitive photodiode region 240 and a cover layer 216a.

The transistor 230 can be a reset transistor or a transmission transistor, for example. The transistor 230 includes a gate dielectric layer 204a, a gate conductive layer 206a, a drain region 212 and a source 213. The gate dielectric layer 204a and the gate conductive layer 206a are formed above a substrate body 200. The source region 213 and a portion of the doped region 214 in the light-sensitive photodiode region 240 are connected. In addition, the doping state of the source region 213 is identical to the doping state of the doped region 214.

The gate dielectric layer 204a can be a silicon oxide layer formed, for example, by thermal oxidation. The gate conductive layer 206a can be a polysilicon layer or a polycide layer (a composite layer that includes a polysilicon layer and a silicide layer) formed, for example, by chemical vapor deposition or sputtering. When the gate conductive layer 206a is a polysilicon layer, the gate conductive layer 206a of the transistor 230 preferably includes a silicide layer 222 and the source/drain regions 212 and 213 preferably include silicide layers 224 and 226 respectively so that electrical resistance is lowered. The silicide layers 222, 224 and 226 can be a silicide layer of a refractory metal such as titanium or cobalt formed by conducting a self-aligned silicide process.

The light-sensitive photodiode region 240 is positioned between the isolation region 202 and the transistor 230 within the substrate body 200. The light-sensitive photodiode region 240 is composed of the doped region 214 and the substrate body 200. The doping state of the doped region 214, the source region 213 and the drain region 212 are identical but different from the substrate body 200. When the substrate body 200 is p-doped, the doped region 214 is n-doped. On the other hand, if the substrate body 200 is n-doped, the doped region 214 is p-doped. According to the manufacturing method of CMOS, the light-sensitive photodiode region 240 can also be formed by the combination of the doped region 214 and a doped well (not shown) between the doped region 214 and the substrate body 200. Hence, the doping state of the doped region 214 includes a doping state identical to the substrate body 200.

The cover layer 216a is formed by a method similar to the formation of the gate dielectric layer 204a over the substrate body 200 in the light-sensitive photodiode region 240. The cover layer can be a silicon oxide layer formed, for example, by thermal oxidation.

FIGS. 2A through 2F are cross-sectional views showing the progression of steps for producing an active photodiode CMOS image sensor according to one preferred embodiment of this invention.

As shown in FIG. 2A, isolation regions 202 are formed in a substrate body 400, for example, by local oxidation of silicon (LOCOS) or shallow trench isolation (STI). The isolation regions 202 mark out the desired active regions. A dielectric layer 204, a conductive layer 206 and a cap layer 208 are sequentially formed over the substrate body 200. The dielectric layer 204 serving as a gate dielectric layer can be a silicon oxide layer formed, for example, by thermal oxidation. The conductive layer 206 can be a polysilicon layer, a polycide layer (a composite layer that includes a polysilicon layer and a silicide layer) or a metallic layer formed, for example, by chemical vapor deposition. The cap layer 208 can be a silicon nitride layer formed, for example, by chemical vapor deposition.

As shown in FIG. 2B, photolithographic and etching processes are carried out to pattern the cap layer 208, the conductive layer 206 and the dielectric layer 204. Ultimately, a gate structure that includes a cap layer 208a, a conductive layer 206a and a dielectric layer 204a is formed. The conductive layer 206a serves as the gate conductive layer of a transistor 203; the dielectric layer 204a serves as the gate dielectric layer of the transistor 230; and the cap layer 208a above the conductive layer 206a is capable of preventing the oxidation of the conductive layer 206a. Using the isolation regions 202 and the cap layer 208a as a mask, an ion implantation 210 is carried out implanting impurities into the substrate body 200. In the ion implantation 210, the implanted impurities include n-type dopants such as phosphorus and arsenic or p-type dopants such as boron.

As shown in FIG. 2C, a thermal drive-in operation and a thermal oxidation are carried out concurrently. The implanted impurities in the substrate body 200 forms source/drain regions 212 and 213 and a doped region 214 that connects the source region 213 and the light-sensitive photodiode region 240. Meanwhile, a silicon oxide cover layer 216 is formed over the exposed substrate surface.

The thermal oxidation is carried out at a temperature identical to the formation of the gate oxide layer. The oxidation is preferably carried out at a temperature between 900 to 1000° C. for about 45 minutes. The doped region 214 in the light-sensitive photodiode region 240 has a dopant concentration lower than the conventional. Hence, a thicker depletion region is formed for the same applied voltage resulting in a higher photoelectric conversion. Furthermore, the cap layer 208a above the gate conductive layer 206a protects the gate conductive layer 206a against oxidation in the thermal oxidation step. Therefore, the oxide cover layer 216 is formed over the exposed substrate surface and the sidewalls of the gate conductive layer 206a only.

As shown in FIG. 2D, photolithographic and etching processes are carried out to remove a portion of the oxide cover layer 216 and to expose the substrate 200 in the source/drain regions 212 and 213. Ultimately, only the oxide cover layer 216a above the light-sensitive region 240 is retained. The cap layer 208a is removed to expose the gate conductive layer 208a. The cap layer 208a can be removed by isotropic etching such as a wet etching using hot phosphoric acid.

As shown in FIG. 2E, spacers 218 are formed on the sidewalls of the gate conductive layer 206a and the gate dielectric layer 204a. The spacers 218 can be a silicon oxide layer formed, for example, by depositing a silicon oxide layer over the substrate 200 in a chemical vapor deposition following by patterning the silicon oxide layer in an anisotropic etching back operation. A self-aligned silicide process is next carried out by forming a metallic layer 220 over the substrate 200. The metallic layer is formed from refractory metals such as titanium, tungsten, cobalt or platinum by sputtering, for example.

As shown in FIG. 2F, an annealing operation is carried out. In the annealing step, metal in the metallic layer 220 reacts with silicon at the interface with the gate conductive layer 206a, the drain region 212 and the source region 213 to form silicide layers 222, 224 and 226 respectively. A wet etching step is conducted to remove the unreacted metal in the metallic layer 220. Thereafter, another annealing operation is carried out to lower the electrical resistance of the silicide layers 222, 224 and 226.

Since the light-sensitive region 240 is covered by the cover layer 216a, there is no direct contact between the light-sensitive region 240 and the metallic layer 220. Hence, metal in the metallic layer 220 will not react with substrate silicon in the light-sensitive region 240 to form a silicide layer. After the unreacted metal in the metallic layer 220 is removed, the cover layer 216a on top of the light-sensitive region 240 is exposed.

In this invention, by forming a cover layer over the light-sensitive photodiode region, no silicide layer is formed over the light-sensitive photodiode region after a self-aligned silicide process. In the absence of a light-reflecting silicide layer, the reflection of a large quantity light from the light-sensitive photodiode region is avoided.

In addition, the cover layer on top of the light-sensitive photodiode region is formed under similar conditions as forming the gate dielectric layer. Since the gate dielectric layer is an oxide layer formed by a quality process, the interface between the dielectric layer and the substrate body has few defects. With very little current leak from the surface of the light-sensitive regions, only a very small dark current flows in the sensing device.

Moreover, since the cover layer is formed in the thermal drive-in step for forming the source/drain region, only one more photomask-making step is required when compared with a standard CMOS manufacturing process.

Furthermore, the light-sensitive photodiode region has a lower dopant concentration than a conventional photodiode region. Consequently, a thicker depletion region is produced when a voltage is applied to the light-sensitive photodiode region. Ultimately, a higher photoelectric conversion rate can be obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active photodiode CMOS image sensor on a substrate body, comprising:

a transistor on the substrate body, wherein the transistor includes a gate dielectric layer, a gate conductive layer and source/drain regions;

a light-sensitive photodiode region within the substrate body, wherein the light-sensitive photodiode region is connected to one of the source/drain regions;

a metal silicide disposed at least on a portion of the source/drain region that is connected with the light-sensitive photodiode region; and a cover layer above the light-sensitive photodiode region, wherein the cover layer is formed using a method similar to the method used to form the gate dielectric layer.

2. The sensor of claim 1, wherein the transistor includes a reset transistor.

3. The sensor of claim 1, wherein transistor includes a transmission transistor.

4. The sensor of claim 1, wherein the cover layer is a silicon oxide layer formed by thermal oxidation.

5. The sensor of claim 1, wherein the light-sensitive photodiode region includes a doped region having a doping state identical to the source/drain region.

6. The sensor of claim 1, wherein the sensor structure further includes a silicide layer over the gate conductive layer and the source/drain regions.

7. The sensor of claim 1, wherein the substrate body is p-doped while the photodiode is an n-doped region.

8. The sensor of claim 1, wherein the substrate body is n-doped while the hotodiode is a p-doped region.

* * * * *